US012638530B2

(12) United States Patent
Zeller

(10) Patent No.: US 12,638,530 B2
(45) Date of Patent: May 26, 2026

(54) MRI RECONSTRUCTION BASED ON NEURAL NETWORKS

(71) Applicant: Siemens Healthineers AG, Forchheim (DE)

(72) Inventor: Mario Zeller, Erlangen (DE)

(73) Assignee: Siemens Healthineers AG, Forchheim (DE)

(*) Notice: Subject to any disclaimer, the term of this patent is extended or adjusted under 35 U.S.C. 154(b) by 322 days.

(21) Appl. No.: 18/226,371

(22) Filed: Jul. 26, 2023

(65) Prior Publication Data

US 2024/0036136 A1 Feb. 1, 2024

(30) Foreign Application Priority Data

Jul. 26, 2022 (EP) .................................... 22186821

(51) Int. Cl.
*G01V 3/00* (2006.01)
*G01R 33/48* (2006.01)
*G01R 33/561* (2006.01)

(52) U.S. Cl.
CPC ........ *G01R 33/482* (2013.01); *G01R 33/5611* (2013.01)

(58) Field of Classification Search
CPC .. G01R 33/58; G01R 33/3607; G01R 33/543; G01R 33/5608
USPC ........................................................ 324/309
See application file for complete search history.

(56) References Cited

U.S. PATENT DOCUMENTS

| | | | | |
|---|---|---|---|---|
| 2016/0199004 A1* | 7/2016 | Meyer | .............. | G01R 33/56509 |
| | | | | 600/410 |
| 2020/0103483 A1 | 4/2020 | Hardy et al. | | |
| 2020/0249299 A1* | 8/2020 | Botnar | .................. | G06T 7/0012 |
| 2020/0249300 A1 | 8/2020 | Sandino et al. | | |

(Continued)

FOREIGN PATENT DOCUMENTS

| | | | | | |
|---|---|---|---|---|---|
| CN | 108596994 A | * | 9/2018 | .......... | G06T 11/005 |
| CN | 110647938 A | * | 1/2020 | .......... | G06F 18/214 |

OTHER PUBLICATIONS

Hammernik, Kerstin et al.: "Systematic Evaluation of Iterative Deep Neural Networks for Fast Parallel MRI Reconstruction with Sensitivity Weighted Coil Combination," Magnetic Resonance in Medicine 86.4; 1859-1872; (2021).

(Continued)

*Primary Examiner* — Walter L Lindsay, Jr.
*Assistant Examiner* — Frederick Wenderoth
(74) *Attorney, Agent, or Firm* — Banner & Witcoff, Ltd.

(57) ABSTRACT

In a method for processing fully sampled k-space MRI imaging data associated with a tissue of interest within a FOV, a neural network may be trained using undersampled k-space MRI imaging data associated with the tissue of interest. At least one subset of the fully sampled k-space MRI imaging data may be obtained based on an input dimension of the trained neural network such that a dimension of each one of the at least one subset is the same as the input dimension. Each one of the at least one subset of the fully sampled k-space MRI imaging data may be processed by the trained neural network, respectively. Spatial domain MRI imaging data associated with the tissue of interest within the FOV may be accordingly determined based on corresponding output of the trained neural network.

15 Claims, 7 Drawing Sheets

(56) References Cited

U.S. PATENT DOCUMENTS

| 2021/0118200 | A1* | 4/2021 | Akcakaya | ................ G06N 3/08 |
| 2021/0364587 | A1 | 11/2021 | De Weerdt et al. | |

OTHER PUBLICATIONS

Zeng, G.: "A Review on Deep Learning MRI Reconstruction Without Fully Sampled K-Space"; BMC Medical Imaging vol. 21, Article No. 195 (2021).

* cited by examiner

MRI RECONSTRUCTION BASED ON NEURAL NETWORKS

CROSS REFERENCE TO RELATED APPLICATIONS

This patent application claims priority to European Patent Application No. 22186821.9, filed Jul. 26, 2022, which is incorporated herein by reference in its entirety.

BACKGROUND

Field

Various examples of the disclosure generally relate to magnetic resonance (MR) imaging (MRI). Various examples specifically relate to applying a neural network trained using undersampled k-space MRI imaging data to reconstruct fully sampled k-space MRI imaging data.

Related Art

MRI plays an important role in clinical medicine, and it can visualize human organs and tissues to help follow-up diagnosis. However, MRI has always faced the challenge of long scan time. Compressed sensing and parallel imaging are two common techniques to accelerate MRI reconstruction. Both techniques acquire undersampled k-space MRI imaging data. Various neural networks, e.g., utilizing deep learning, for MRI reconstruction without fully sampled data are available, i.e., relying on undersampled k-space data, for example, as disclosed in Zeng, Gushan, et al. "*A review on deep learning MRI reconstruction without fully sampled k-space.*" BMC Medical Imaging 21.1 (2021): 1-11.

Low-field MRI systems (generally defined as systems in the range 0.25-1.0 T (Tesla)) usually exhibit a low signal-to-noise ratio (SNR). In low-field MRI applications, there is often the situation that MRI acquisition protocols (or MRI scanning pulse sequence) are defined without taking parallel imaging into account and/or considering additional averages into account, i.e., repeating the whole sequence over again (or repeating each phase-encoding step over again). This is done to average out the MRI imaging data and increase the SNR.

Therefore, a need exists for advanced techniques for MRI imaging. Specifically, a need exists for MRI imaging operating based on fully sampled k-space data, e.g., obtained using a low-field MRI system. A need exists for MRI imaging providing high quality images.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
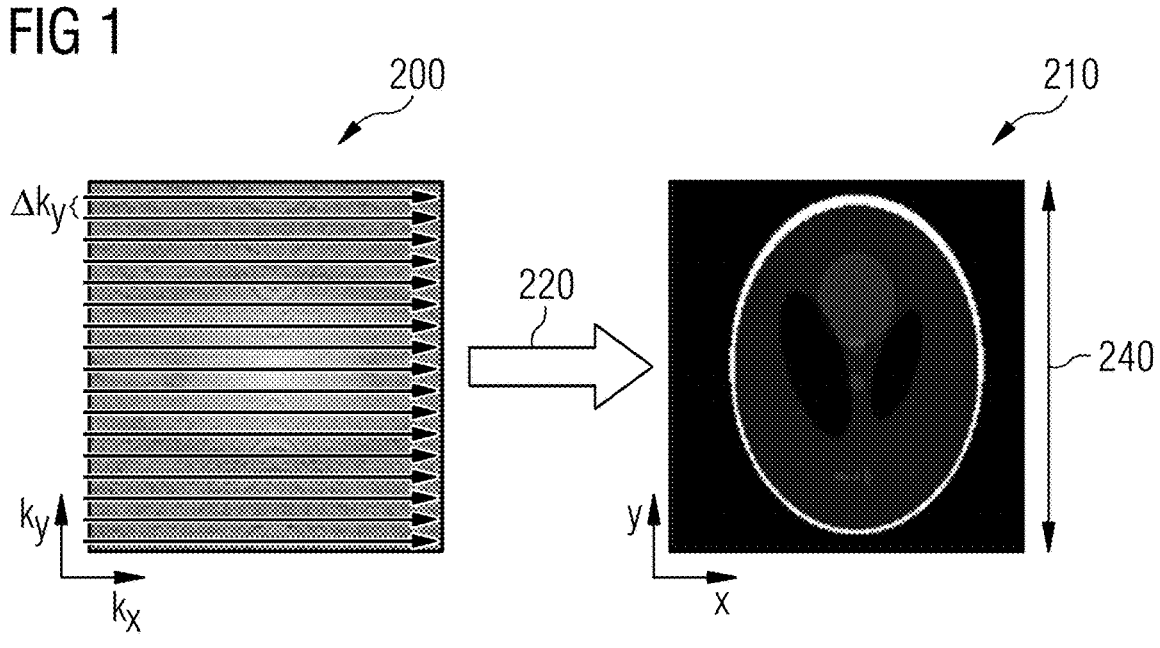

FIG. 1 schematically illustrates an exemplary acquisition of fully sampled k-space MRI imaging data and the resulting full FOV spatial domain MRI imaging data.

Figure 2:
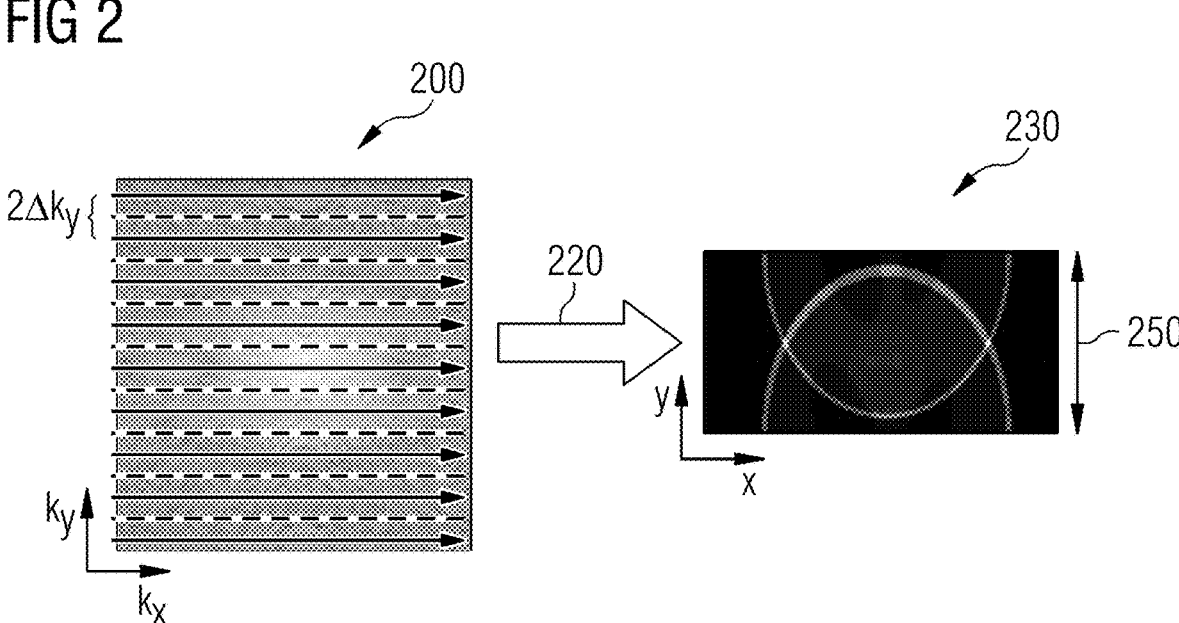

FIG. 2 schematically illustrates an exemplary acquisition of undersampled k-space MRI imaging data and the resulting reduced FOV spatial domain MRI imaging data with aliasing artifacts.

Figure 3:
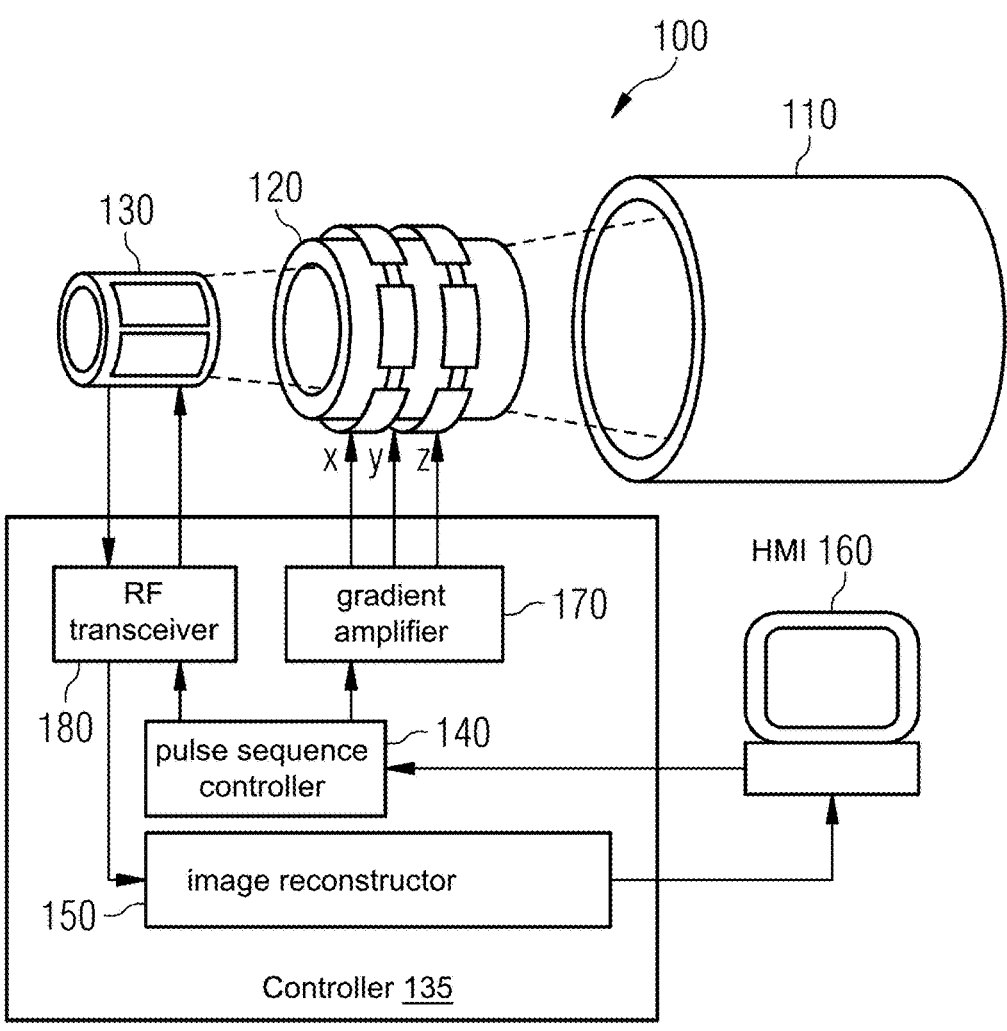

FIG. 3 schematically illustrates an MRI scanner according to one or more exemplary embodiments of the disclosure.

Figure 4:
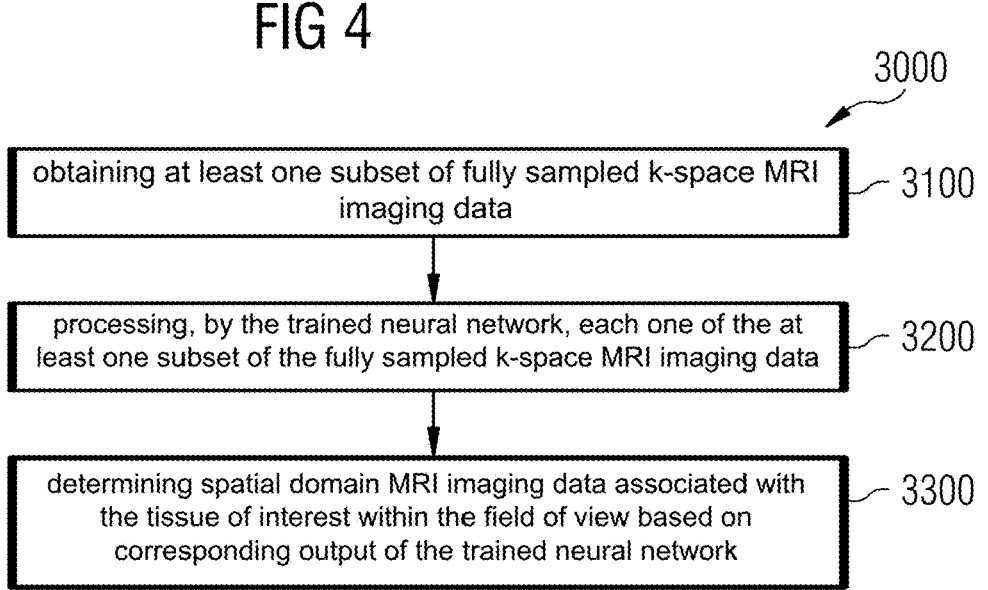

FIG. 4 schematically illustrates a flowchart of a method according to one or more exemplary embodiments of the disclosure.

Figure 5:
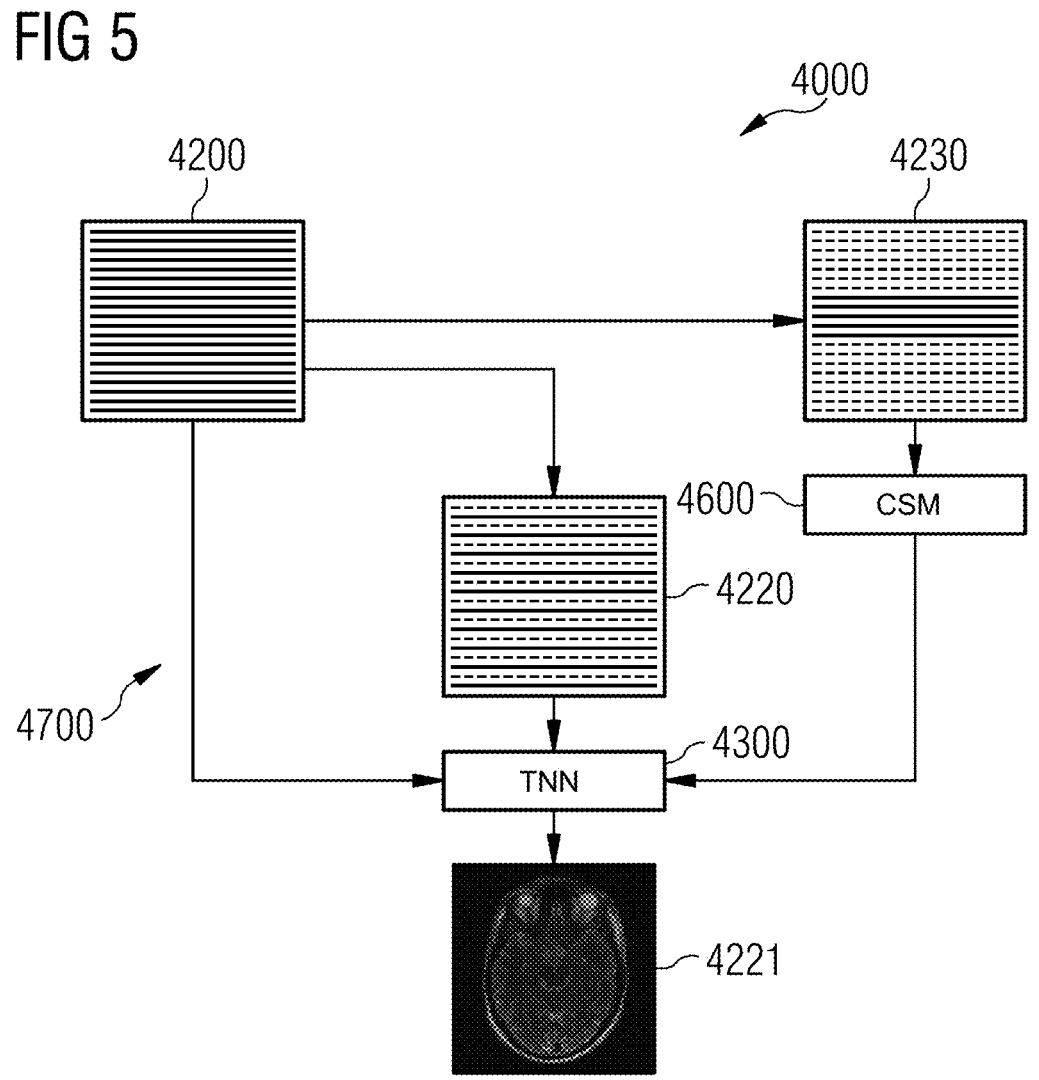

FIG. 5 schematically illustrates an exemplary processing pipeline according to one or more exemplary embodiments of the disclosure.

Figure 6:
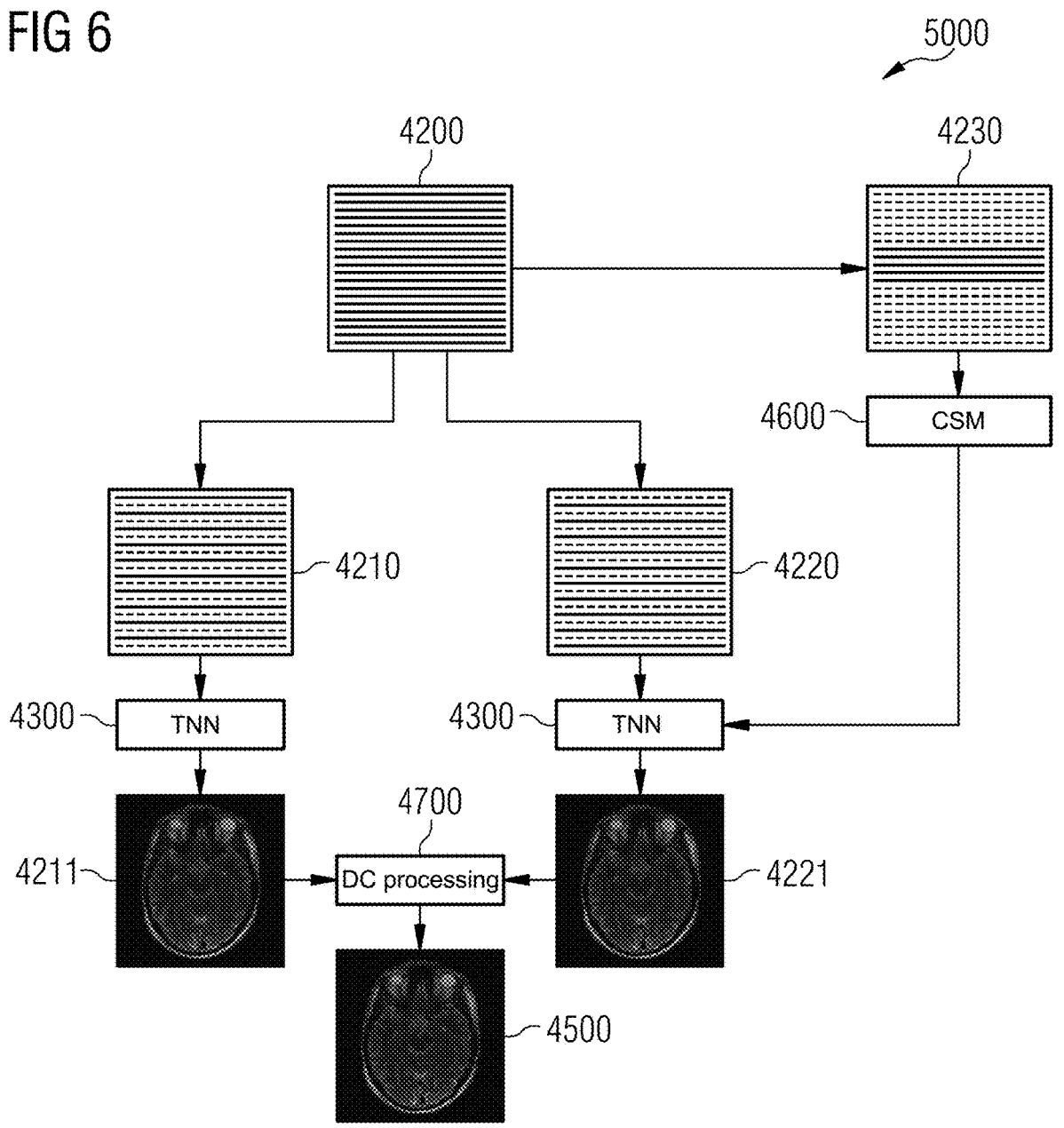

FIG. 6 schematically illustrates a processing pipeline according to one or more exemplary embodiments of the disclosure.

Figure 7:
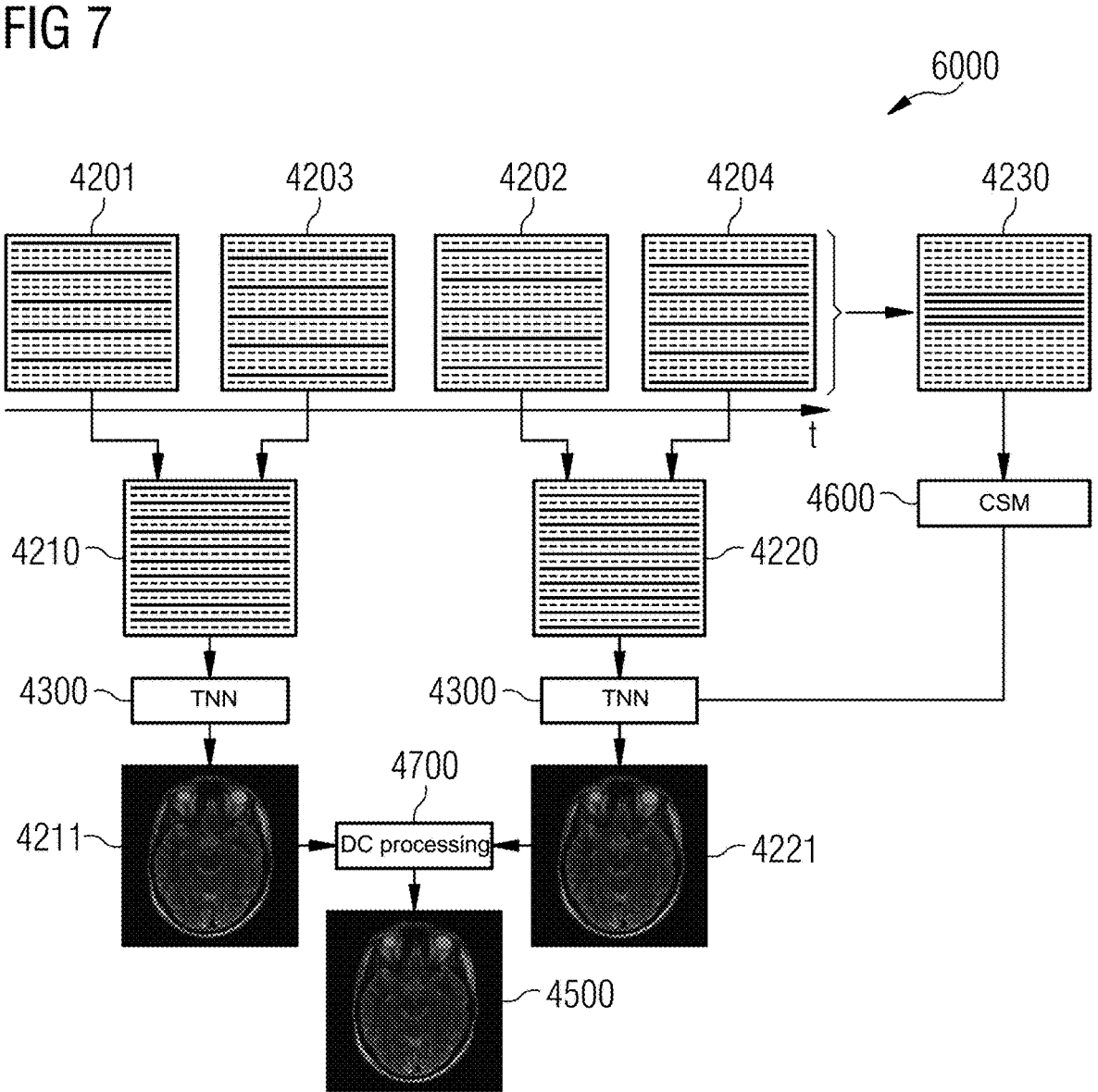

FIG. 7 schematically illustrates a processing pipeline according to one or more exemplary embodiments of the disclosure.

Figure 8:
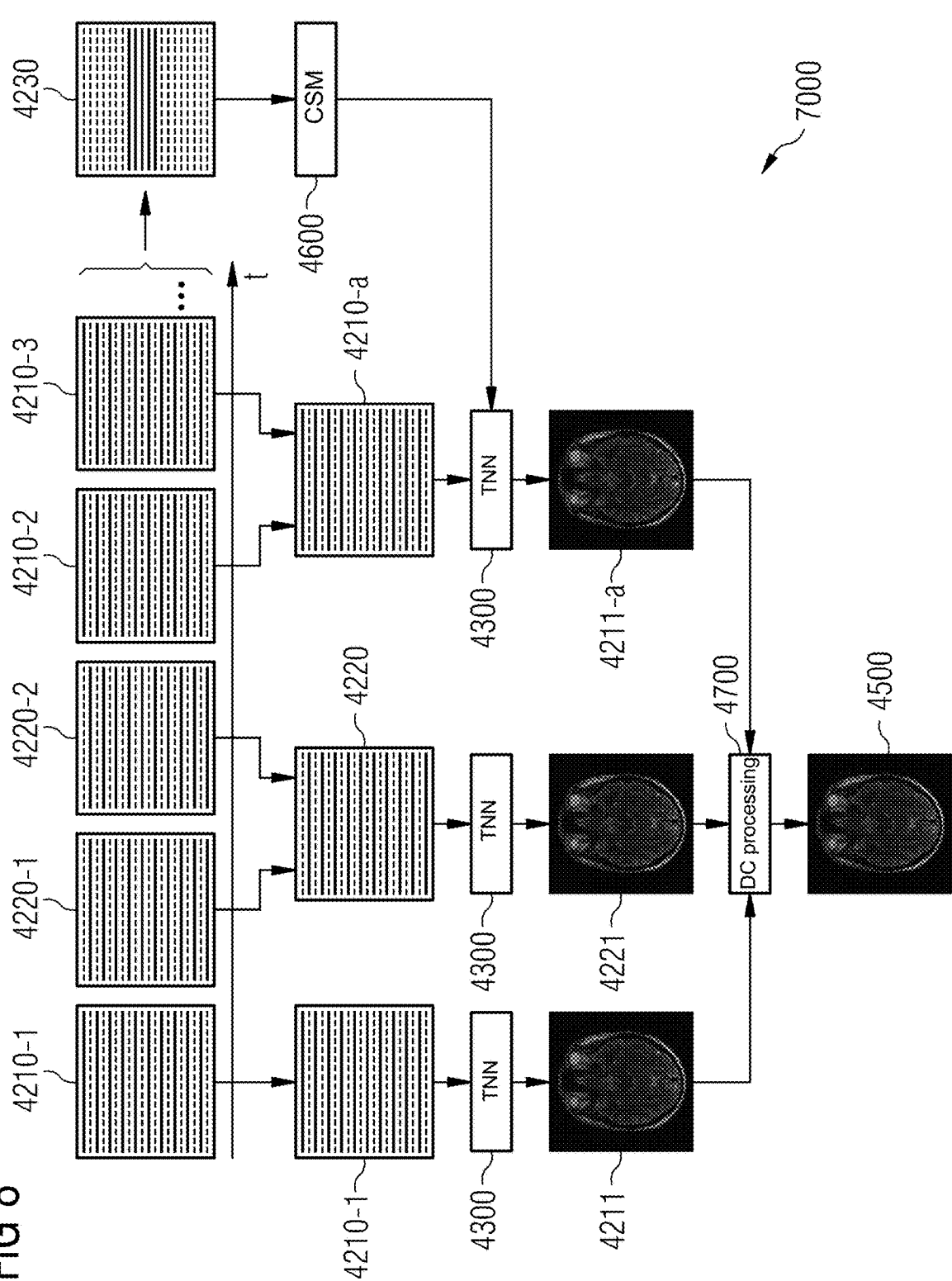

FIG. 8 schematically illustrates a processing pipeline according to one or more exemplary embodiments of the disclosure.

Figure 9:
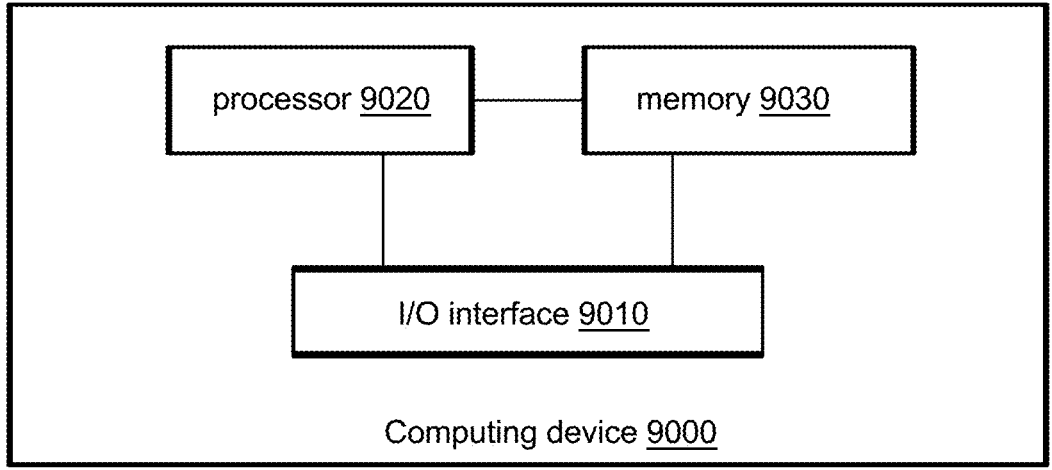

FIG. 9 is a block diagram of a device according to one or more exemplary embodiments of the disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

Some examples of the present disclosure generally provide for a plurality of circuits or other electrical devices. All references to the circuits and other electrical devices and the functionality provided by each are not intended to be limited to encompassing only what is illustrated and described herein. While particular labels may be assigned to the various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired. It is recognized that any circuit or other electrical device disclosed herein may include any number of microcontrollers, a graphics processor unit (GPU), integrated circuits, memory devices (e.g., FLASH, random access memory (RAM), read only memory (ROM), electrically programmable read only memory (EPROM), electrically erasable programmable read only memory (EEPROM), or other suitable variants thereof), and software which co-act with one another to perform operation(s) disclosed herein. In addition, any one or more of the electrical devices may be configured to execute a program code that is embodied in a non-transitory computer readable medium programmed to perform any number of the functions as disclosed.

The drawings are to be regarded as being schematic representations and elements illustrated in the drawings are not necessarily shown to scale. Rather, the various elements are represented such that their function and general purpose become apparent to a person skilled in the art. Any connection or coupling between functional blocks, devices, components, or other physical or functional units shown in the drawings or described herein may also be implemented by an indirect connection or coupling. A coupling between components may also be established over a wireless connection. Functional blocks may be implemented in hardware, firmware, software, or a combination thereof.

A computer-implemented method for processing fully sampled k-space MRI imaging data associated with a tissue of interest within a field of view is provided. The method comprises obtaining, based on an input dimension of a trained neural network, at least one subset of the fully sampled k-space MRI imaging data such that a dimension of each one of the at least one subset is the same as the input dimension. The trained neural network is trained using undersampled k-space MRI imaging data associated with the tissue of interest. The method further comprises processing, by the trained neural network, each one of the at least one subset of the fully sampled k-space MRI imaging data, respectively, and determining spatial domain MRI imaging data associated with the tissue of interest within the field of view based on corresponding output of the trained neural network.

A computing device comprising a processor and a memory is provided. Upon loading and executing program code from the memory, the processor is configured to perform a method for processing fully sampled k-space MRI imaging data associated with a tissue of interest within a field of view. The method comprises obtaining, based on an input dimension of a trained neural network, at least one subset of the fully sampled k-space MRI imaging data such that a dimension of each one of the at least one subset is the same as the input dimension. The trained neural network is trained using undersampled k-space MRI imaging data associated with the tissue of interest. The method further comprises processing, by the trained neural network, each one of the at least one subset of the fully sampled k-space MRI imaging data, respectively, and determining spatial domain MRI imaging data associated with the tissue of interest within the field of view based on corresponding output of the trained neural network.

An MRI scanner comprising a computing device is provided. The computing device comprises a processor and a memory. Upon loading and executing program code from the memory, the processor is configured to perform a method for processing fully sampled k-space MRI imaging data associated with a tissue of interest within a field of view. The method comprises obtaining, based on an input dimension of a trained neural network, at least one subset of the fully sampled k-space MRI imaging data such that a dimension of each one of the at least one subset is the same as the input dimension. The trained neural network is trained using undersampled k-space MRI imaging data associated with the tissue of interest. The method further comprises processing, by the trained neural network, each one of the at least one subset of the fully sampled k-space MRI imaging data, respectively, and determining spatial domain MRI imaging data associated with the tissue of interest within the field of view based on corresponding output of the trained neural network.

A computer program product or a computer program or a computer-readable storage medium including program code is provided. The program code can be executed by at least one processor. Executing the program code causes the at least one processor to perform a method for processing fully sampled k-space MRI imaging data associated with a tissue of interest within a field of view. The method comprises obtaining, based on an input dimension of a trained neural network, at least one subset of the fully sampled k-space MRI imaging data such that a dimension of each one of the at least one subset is the same as the input dimension. The trained neural network is trained using undersampled k-space MRI imaging data associated with the tissue of interest. The method further comprises processing, by the trained neural network, each one of the at least one subset of the fully sampled k-space MRI imaging data, respectively, and determining spatial domain MRI imaging data associated with the tissue of interest within the field of view based on corresponding output of the trained neural network.

Hereinafter, techniques of MRI are described. MRI may be employed to obtain raw MR signals of magnetization of nuclear spins of a sample region of a patient (MR data), e.g., a region of the heart, the brain, the liver, or the lung of the patient. The sample region defines a field of view (FOV). The FOV typically includes a tissue of interest and surrounding tissue or background. The MR data are typically defined in k-space (k-space MRI imaging data). Based on the k-space MRI imaging data, MR images in the spatial domain can be determined (spatial domain MRI imaging data). As a general rule, the terms k-space MRI imaging data and spatial domain MRI imaging data may respectively denote a 2-D or 3-D k-space dataset and a 2-D or 3-D spatial dataset. Hereinafter, 2-D data will be used as exemplary data to describe various techniques of this disclosure.

According to this disclosure, techniques for processing fully sampled k-space MRI imaging data associated with a tissue of interest within a FOV are disclosed. A neural network is trained using undersampled k-space MRI imaging data associated with the tissue of interest. At least one subset of the fully sampled k-space MRI imaging data is obtained based on an input dimension of the trained neural network such that a dimension of each one of the at least one subset is the same as the input dimension. Each one of the at least one subset of the fully sampled k-space MRI imaging data is processed by the trained neural network, respectively, and spatial domain MRI imaging data associated with the tissue of interest within the FOV are accordingly determined based on corresponding output of the trained neural network.

Such techniques are based on the finding that using low-field MRI systems and respective MRI acquisition protocols, oftentimes fully sampled k-space MRI imaging data is available.

On the other hand, fast MRI imaging techniques are usually used in clinical practice and undersampled k-space MRI imaging data are acquired accordingly. Thus, there are many available conventional neural networks, which are trained using such undersampled k-space MRI imaging data.

Techniques are disclosed which enable the application of neural networks available in the prior art to fully sampled k-space data; this provides an additional benefit of increased image quality. According to examples, it is possible to extract sub-sets of fully sampled k-space data to match the intended input format of the neural network.

For instance, a dimension of the fully sampled k-space MRI imaging data, e.g., 512 pixels*512 pixels, does not match an input dimension of the neural networks, e.g., 256 pixels*512 pixels, i.e., a dimension of the undersampled data for network training. By extracting a corresponding subset (or multiple subsets), the dimensions can match.

In general, a k-space MRI imaging data set is referred to as fully sampled, also known as full-Nyquist-sampled, if a k-space sampling interval $\Delta k$ ($\Delta k_x$ and/or $\Delta k_y$) is chosen in the limits determined based on Nyquist-Shannon sampling theorem. Otherwise, it is termed undersampled or sub-Nyquist-sampled.

FIG. 1 schematically illustrates an exemplary acquisition of fully sampled k-space MRI imaging data of a k-space image 200 and the resulting full FOV 240 spatial domain MRI imaging data 210. Each of the solid lines with an arrow indicates acquired or sampled k-space lines. The space sampling interval along the $k_y$ direction is $\Delta k_y$. Here, sufficient samples (i.e., the solid lines) are acquired in the k-space so that the spatial domain MRI imaging data 210 can be reconstructed by simply taking the inverse Fourier transform 220 of the acquired fully sampled k-space MRI imaging data.

On the other hand, FIG. 2 schematically illustrates an exemplary acquisition of undersampled k-space MRI imaging data of the k-space image 200 of FIG. 1 and the resulting reduced FOV 250 spatial domain MRI imaging data 230 with aliasing artifacts. Each of the solid lines with an arrow indicates acquired or sampled k-space lines, and each of the dashed lines indicates the unacquired lines. The space sampling interval along the $k_y$-direction is $2\Delta k_y$, e.g., corresponding to a parallel imaging with a reduction factor R=2. Compared with FIG. 1, since every other lines of the k-space image 200 along the $k_y$ direction is skipped during data acquisition, after taking the inverse Fourier transform 220, the acquired data results in reduced FOV 250 spatial domain MRI imaging data 230 with aliasing artifacts. Typically, in fast MRI imaging techniques, phase encoding steps are reduced and readout sampling points are kept identical as the time benefit of reducing the readout windows is typically negligible. I.e., the FOV 250 has a half width of the full FOV 240 along the y direction but has the same length along the x direction.

According to various examples, the output of the neural network trained using undersampled k-space MRI imaging data (e.g., the data indicated by solid lines in FIG. 2) is a full FOV spatial domain MRI imaging data (e.g., the full FOV 240 spatial domain MRI imaging data 210 of FIG. 1), but not a reduced FOV spatial domain MRI imaging data with aliasing artifacts (e.g., the reduced FOV 250 spatial domain MRI imaging data 230 of FIG. 2). I.e., the trained neural network is able to reconstruct full FOV spatial domain MRI imaging data from undersampled k-space MRI imaging data, which may be any available neural network disclosed prior to the filing date of this disclosure.

According to various examples, the undersampled k-space MRI imaging data used for training the neural network may be obtained using parallel imaging techniques or compressed sensing techniques.

According to various examples, the undersampled k-space MRI imaging data may be acquired using an MRI scanner which has a main or static magnetic field strength equal to or greater than 1 T. Additionally or alternatively, the undersampled k-space MRI imaging data may be acquired using an MRI scanner which has a main or static magnetic field strength less than 1 T. Further, the fully sampled k-space MRI imaging data may be acquired using an MRI scanner with any main field strength.

According to this disclosure, both the undersampled k-space MRI imaging data (e.g., solid lines with an arrow as show in FIG. 2) and the fully sampled k-space MRI imaging data (e.g., solid lines with an arrow as shown in FIG. 1) may be acquired using either a single-shot MRI scanning pulse sequence, such as Half-Fourier Acquisition Single-shot Turbo spin Echo (HASTE) sequence, Single-shot fast spin echo (SS-FSE), Single-shot turbo spin echo (SSH-TSE), ultra-fast spin echo (UFSE), Single-shot fast spin echo, Fast Advanced Spin Echo (FASE), and SuperFASE, or a multi-shot MRI scanning pulse sequence, such as FSE, TSE, and multi-shot echo planar imaging (EPI). In single-shot techniques, MR data from all of k-space of an image is obtained after a single 90°-excitation pulse. This requires very long echo trains, which may number 128, 256, or even higher. On the other hand, in multi-shot techniques, data from all of k-space of an image is respectively obtained after several separate RF-excitations. For example, if 128 lines of k-space were to be sampled, a FSE/TSE sequence with an ETL (echo train length)/Turbo factor of 16 would require 128/16=8 "shots" to completely collect all the data.

By obtaining, based on an input dimension of a trained neural network, at least one subset of a fully sampled k-space MRI imaging data (such that a dimension of each one of the at least one subset is the same as the input dimension), it becomes possible that each one of the at least one subset of the fully sampled k-space MRI imaging data is respectively processed by the trained neural network. Accordingly, a full FOV spatial domain MRI imaging data can be determined based on corresponding output of the trained neural network. I.e., the fully sampled k-space MRI imaging data can be reconstructed using a trained neural network which is trained using undersampled k-space MRI imaging data. Therefore, there is no need to develop and/or train of dedicated neural networks for reconstructing fully sampled k-space data. I.e., a neural network trained using undersampled k-space MRI imaging data can be used to reconstruct either undersampled k-space MRI imaging data or fully sampled k-space data. Further, it is also possible to increase the quality of reconstructed images, especially for low-field MRI systems.

FIG. 3 illustrates aspects with respect to an MRI scanner 100. The MRI scanner 100 can be used to perform acquisitions of fully sampled k-space data and/or of undersampled k-space MRI imaging data. Further, the MRI scanner 100 can be configured to reconstruct full FOV spatial domain MRI imaging data from either fully sampled k-space data or undersampled k-space MRI imaging data using techniques disclosed herein. In an exemplary embodiment, the MRI scanner 100 may include: the main magnet 110; a set of gradient coils 120 to provide switchable spatial gradients in the main magnetic field; radio frequency (RF) coils 130 (or resonators) for the transmission and reception of radio frequency pulses; and a controller 135 configured to control the operation of the MRI scanner 100 and/or one or more components therein. The controller 135 may include pulse sequence electronics (pulse sequence controller) 140 for programming the timing of transmission signals (excitation pulse, gradient signals); image reconstruction electronics (image reconstructor) 150 and a human machine interface 160 for viewing, manipulating, and storing images. In an exemplary embodiment, the controller 135 (and/or one or more components comprised therein) includes processing circuitry that is configured to perform one or more functions and/or operations of the controller 135 (and/or component(s) therein).

A common type of the main magnet 110 used in MRI systems is the cylindrical superconducting magnet (typically with a 1 meter bore size). The main magnet 110 can provide a main magnet field with a field strength varying from 0.5 T (21 MHz) to 3.0 T (128 MHz), even 9 T (383 MHz), along its longitudinal axis. The main magnetic field can align the magnetization of the nuclear spins of a patient along the longitudinal axis. The patient can be moved into the bore by means of a sliding table (not shown in FIG. 3). The gradient coils 120 fit inside the bore of the main magnet 110 (after any active shimming coils, if present). The function of the gradient coils 120 is to provide a temporary change in the magnitude of the main magnetic field as a function of position in the bore of the main magnet 110. The gradient coils 120 provide a spatial encoding of the magnetic field strength, to thereby choose slices of the patient body for selective imaging. In this way, MRI can be tomographic—i.e., it can image slices. The gradient coils 120 also provide the means to spatially encode the voxels within a given image slice so that the individual echoes coming from each voxel can be discriminated and turned into an MR image. There are usually three orthogonal gradient coils, one for each of the physical x, y, and z directions. The gradients can be used for slice selection (slice-selection gradients), frequency encoding (readout gradients), and phase encoding along one or more phase-encoding directions (phase-encoding gradients). Hereinafter, the slice-selection direction will be defined as being aligned along the Z-axis; the readout direction will be defined as being aligned with the X-axis; and a first phase-encoding direction as being aligned with the Y-axis. A second phase-encoding direction may be aligned with the Z-axis. The directions along which the various gradients are applied are not necessarily in parallel with the axes defined by the gradient coils 120. Rather, it is possible that these directions are defined by a certain k-space trajectory which, in turn, can be defined by certain requirements of the respective MRI pulse sequence and/or based on anatomic properties of a patient. The gradient coils 120 usually coupled with the pulse sequence electronics 140 via gradient amplifiers 170.

RF pulses that are oscillating at the Larmor frequency applied around a sample causes nuclear spins to precess, tipping them toward the transverse plane. Once a spin system is excited, coherently rotating spins can induce RF currents (at the Larmor frequency) in nearby antennas, yielding measurable signals associated with the free induction decay and echoes. Thus, the RF coils 130 serve to both induce spin precession and to detect signals indicative of the precession of the nuclear spins. The RF coils 130 usually coupled with both the pulse sequence electronics 140 and the image reconstruction electronics 150 via RF electronics 180, respectively.

For creating such RF pulses, an RF transmitter (e.g., a part of the RF electronics 180) is connected via an RF switch (e.g., a part of the RF electronics 180) with the RF coils 130.

Via an RF receiver (e.g., a part of the RF electronics 180), it is possible to detect the induced currents or signals by the spin system. In particular, it is possible to detect echoes; echoes may be formed by applying one or more RF pulses (spin echo) and/or by applying one or more gradients (gradient echo). The respectively induced currents or signals can correspond to raw MRI data in k-space; according to various examples, the MRI data can be processed using reconstruction techniques in order to obtain MRI images.

The human machine interface 160 might include at least one of a screen, a keyboard, a mouse, etc. By means of the human machine interface 160, a user input can be detected and output to the user can be implemented. For example, by means of the human machine interface 160, it is possible to select and configure the scanning pulse sequence, e.g., a gradient-echo sequence or fast spin-echo sequence, graphically select the orientation of the scan planes to image, review images obtained, and change variables in the pulse sequence to modify the contrast between tissues. The human machine interface 160 is respectively connected to the pulse sequence electronics 140 and the image reconstruction electronics 150, such as an array processor, which performs the image reconstruction.

The pulse sequence electronics 140 may include a GPU and/or a CPU and/or an application-specific integrated circuit and/or a field-programmable array. The pulse sequence electronics 140 may implement various control functionality with respect to the operation of the MRI scanner 100, e.g. based on program code loaded from a memory. For example, the pulse sequence electronics 140 could implement a sequence control for time-synchronized operation of the gradient coils 120, both the RF transmitter and the RF receiver of the RF electronics 180.

The image reconstruction electronics 150 may include a GPU and/or a CPU and/or an application-specific integrated circuit and/or a field-programmable array. The image reconstruction electronics 150 can be configured to implement pre-processing and/or post-processing for reconstruction of MRI images. For example, the image reconstruction electronics 150 can be configured to perform either full sampling or undersampling of k-space MRI imaging data, and/or motion correction of the reconstructed spatial domain MRI imaging data.

The pulse sequence electronics 140 and the image reconstruction electronics 150 may be a single circuit, or two separate circuits.

The MRI scanner 100 may be connectable to a database (not shown in FIG. 3), such as a picture archiving and communication system (PACS) located within a local network of a hospital, for storing acquired MRI data, and/or, MRI images in k-space, and reconstructed MRI images in spatial domain.

Details with respect to techniques, such as the functioning of the MRI scanner 100, particularly the functioning of the image reconstruction electronics 150 are described in connection with FIG. 4.

FIG. 4 is a flowchart of a method 3000 according to various examples. For example, the method 3000 according to FIG. 4 may be executed by the image reconstruction electronics 150 of the MRI scanner 100 according to the example of FIG. 3, e.g., upon loading program code from a memory. The method 3000 may be executed by the image reconstruction electronics 150 together with the pulse sequence electronics 140, for example, the image reconstruction electronics 150 may be configured to process MRI imaging data and the pulse sequence electronics 140 may be configured to generate an MRI imaging sequence, e.g., either a single-shot or a multi-shot MRI scanning pulse sequence. Further, the method 3000 may be executed by the image reconstruction electronics 150 itself. It would also be possible that the method 3000 is at least partially executed by a separate compute unit, e.g., at a server backend.

FIG. 4 illustrates aspects with respect to processing fully sampled k-space MRI imaging data (e.g., the solid lines with an arrow of FIG. 1) associated with a tissue of interest within a FOV are disclosed. The k-space MRI imaging data may be acquired using an MRI apparatus operating at, e.g., not more than 1.5 or 2 T. A neural network is trained using undersampled k-space MRI imaging data (e.g., the solid lines with an arrow of FIG. 2) associated with the tissue of interest. At least one subset of the fully sampled k-space MRI imaging data is obtained based on an input dimension of the trained neural network such that a dimension of each one of the at least one subset is the same as the input dimension. Each one of the at least one subset of the fully sampled k-space MRI imaging data is processed by the trained neural network, respectively, and spatial domain MRI imaging data (e.g., spatial domain MRI imaging data 210 of FIG. 1) associated with the tissue of interest within the FOV are accordingly determined based on corresponding output of the trained neural network. Details of the method 3000 are described in connection with various processing pipelines as shown in FIG. 5-FIG. 8.

Block 3100: obtaining, based on an input dimension of a trained neural network, at least one subset of fully sampled k-space MRI imaging data such that a dimension of each one of the at least one subset is the same as the input dimension. The fully sampled k-space MRI imaging data is associated with a tissue of interest within a field of view 240. The trained neural network is trained using undersampled k-space MRI imaging data associated with the tissue of interest.

The fully sampled k-space MRI imaging data may be obtained from either an MRI scanner, such as the MRI scanner 100 of FIG. 3, or a database, e.g., a PACS or other database.

A dimension of the fully sampled k-space MRI imaging data and the input dimension of the trained neural network may be 512 pixels*512 pixels and 256 pixels*512 pixels, respectively, and thereby the fully sampled k-space MRI imaging data can be divided into two subsets each of which has the same dimension as the input dimension, i.e., 256 pixels*512 pixels. For instance, one subset may comprise odd lines of the fully sampled k-space MRI imaging data, and the other subset may comprise even lines of the fully sampled k-space MRI imaging data.

The obtaining of the at least one subset of the fully sampled k-space MRI imaging data may vary depending on which type of MRI scanning pulse sequence, a single-shot sequence or a multi-shot sequence, is used to acquire the fully sampled k-space MRI imaging data. Details of exemplary obtaining of the at least one subset of the fully sampled k-space MRI imaging data are described in connection with processing pipelines 4000, 5000, 6000, and 7000 as respectively shown in FIG. 5-FIG. 8.

Single-Shot Sequence:

If the fully sampled k-space MRI imaging data is acquired using a single-shot sequence, i.e., acquired in a single-shot MRI measurement, the obtaining of the at least one subset of the fully sampled k-space MRI imaging data may comprise: subsampling, based on the input dimension, the fully sampled k-space MRI imaging data to two or more segments such that a dimension of each of the two or more segments is the same as the input dimension, and arbitrarily selecting, among the two or more segments, at least one segment as the at least one subset of the fully sampled k-space MRI imaging data.

FIG. 5 schematically illustrates an exemplary processing pipeline of the fully sampled k-space MRI imaging data 4200 according to various examples, in which one subset 4220 of the fully sampled k-space MRI imaging data 4200 is obtained and then processed by the trained neural network 4300. As shown in FIG. 5, even lines of the fully sampled k-space MRI imaging data 4200 are respectively subsampled from the fully sampled k-space MRI imaging data 4200, i.e., a segment 4220 comprises even lines of the fully sampled k-space MRI imaging data 4200. The segment 4220 is then selected as the input to the trained neural network 4300 for determining spatial domain MRI imaging data 4221. It is also possible to subsample odd lines of the fully sampled k-space MRI imaging data 4200 and select the segment comprising the odd lines as the input to the trained neural network 4300 for determining spatial domain MRI imaging data 4221.

FIG. 6 schematically illustrates a further exemplary processing pipeline according to various examples, in which two subsets 4210 and 4220 of the fully sampled k-space MRI imaging data 4200 are obtained and then processed by the trained neural network 4300, respectively. As shown in FIG. 6, both odd and even lines of the fully sampled k-space MRI imaging data 4200 are respectively subsampled from the fully sampled k-space MRI imaging data 4200, i.e., segments 4210 and 4220 respectively comprise odd lines and even lines. Bothe segments 4210 and 4220 are selected as input to the trained neural network 4300. Here, it is possible to process both segments 4210 and 4220 using a single trained neural network 4300, respectively. Alternatively, it is also possible to process both segments 4210 and 4220 using two copies of the trained neural network 4300 in parallel (as shown in FIG. 6).

In the exemplary processing pipeline of either FIG. 5 or FIG. 6, it is also possible to subsample the fully sampled k-space MRI imaging data 4200 into 3, 4, or even more subsets based on the input dimension of the trained neural network 4300. For example, the fully sampled k-space MRI imaging data 4200 may be subsampled into 4 subsets/segments by subsampling every fourth lines.

To average out noises and increase SNR, the single-shot sequence can be repeated again to obtain/acquire a further fully sampled k-space MRI imaging data associated with the tissue of interest within the field of view 240 in a further single-shot MRI measurement (not shown in either FIG. 5 or FIG. 6). The method 3000 may further comprise determining a combination of the fully sampled k-space MRI imaging data 4200 and the further fully sampled k-space MRI imaging data and the subsampling of the fully sampled k-space MRI imaging data is based on the combination. For example, matrix addition operation can be applied to the fully sampled k-space MRI imaging data 4200 and the further fully sampled k-space MRI imaging data to obtain the combination, i.e., the combination is a sum of the two fully sampled k-space MRI imaging data. Alternatively, a weighted sum of the two fully sampled k-space MRI imaging data may be determined as the combination. For example, each of the two fully sampled k-space MRI imaging data may have a 0.5 weight, i.e., the combination is an average of the two fully sampled k-space MRI imaging data. Alternatively, each of the two fully sampled k-space MRI imaging data may have a different weight, e.g., 0.4 and 0.6, respectively.

According to various examples, the further fully sampled k-space MRI imaging data is acquired right after the fully sampled k-space MRI imaging data.

Multi-Shot Sequence:

The fully sampled k-space MRI imaging data may be acquired using a multi-shot sequence, i.e., acquired in a multi-shot MRI measurement, and a respective segment of the fully sampled k-space MRI imaging data may be acquired in each of the multiple shots. If a dimension of the respective segment is the same as the input dimension of the trained neural network 4300, the obtaining of the at least one subsets of the fully sampled k-space MRI imaging data may comprise arbitrarily selecting, among the respective segments acquired in the multiple shots, at least one segment as the at least one subset. Alternatively, if the dimension of the respective segment is smaller than the input dimension, the obtaining of the at least one subsets of the fully sampled k-space MRI imaging data may comprise combining two or more segments of the respective segments of the fully sampled k-space MRI imaging data such that a dimension of a combination of the two or more segments is the same as the input dimension, and selecting the combination as one of the at least one subset.

FIG. 7 schematically illustrates a still further exemplary processing pipeline of fully sampled k-space MRI imaging data according to various examples. The fully sampled k-space MRI imaging data may be obtained in four-shot MRI measurement and four segments 4201, 4202, 4203, and 4204 are respectively acquired in each of the four shots. The four segments 4201, 4202, 4203, and 4204 are respectively acquired starting from the first, second, third, and fourth line of the k-space and respectively, and each of the four segments comprises lines collected every fourth line. Since the input dimension of the trained neural network 4300 is bigger than that of each of the four segments 4201, 4202, 4203, and 4204, e.g., two times as big as the dimension of each of the four segments, the two segments 4201 and 4203 which respectively comprise odd lines are combined to obtain a subset 4210 of the fully sampled k-space MRI imaging data which comprises all odd lines. Similarly, the two segments 4202 and 4204 which respectively comprise even lines are combined to obtain a subset 4220 of the fully sampled k-space MRI imaging data which comprises all even lines. Then, the two subsets 4210 and 4220 may be processed by the trained neural network 4300 in the same manner as that of FIG. 6.

To average out noises and increase SNR, at least one shot of the multi-shot sequence can be repeated again, i.e., at least one shot of a further multi-shot MRI measurement is taken, to obtain or acquire at least one segment of a further fully sampled k-space MRI imaging data associated with the tissue of interest within the field of view. A respective segment of the at least one segment of the further fully sampled k-space MRI imaging data is acquired in a respective shot of the further multi-shot MRI measurement. The method may further comprise determining a respective combination of the respective segment of the fully sampled k-space MRI imaging data and the respective segment of the further fully sampled k-space MRI imaging data; and either said arbitrary selecting or said combining is based on the respective combination. Here, the further multi-shot MRI measurement may comprise fewer shots than the (previous) multi-shot MRI measurement, i.e., several but not all shots of the multi-shot sequence are repeated again. Alternatively, the same shot of the (previous) multi-shot MRI measurement and of the further multi-shot MRI measurement can be taken successively. Or, all shots of the (previous) multi-shot MRI measurement are taken first and then taking all or some shots of the further multi-shot MRI measurement. Optionally or additionally, at least one shot of the multi-shot sequence can be repeated more than once, e.g., two times, three times, or even more.

According to various examples, the determining of the respective combination of the respective segment of the fully sampled k-space MRI imaging data and the respective segment of the further fully sampled k-space MRI imaging data may comprise determining a sum of the two segments, a weighted sum of the two segments, or an average of the two segments.

According to various examples, the further fully sampled k-space MRI imaging data is acquired right after the fully sampled k-space MRI imaging data.

FIG. 8 schematically illustrates a still further exemplary processing pipeline of fully sampled k-space MRI imaging data according to various examples. The fully sampled k-space MRI imaging data and the further fully sampled k-space MRI imaging data may be respectively obtained in two-shot MRI measurement and two segments, e.g., 4210-1 and 4220-1, or 4210-2 and 4220-2, can be respectively acquired in each shot of a respective MRI measurement. I.e., in the (first) two-shot MRI measurement, the two segments 4210-1 and 4220-1 of the fully sampled k-space MRI imaging data are successively acquired, and then, in the further (or second) two-shot MRI measurement, the two segments 4220-2 and 4210-2 are successively acquired. Additionally or optionally, a segment 4210-3 of a third two-shot MRI measurement may be acquired. Here, the segments 4210-1, 4210-2, and 4210-3 all comprise odd lines of the k-space, and the segments 4220-1 and 4220-2 both comprise even lines of the k-space. The segments 4210-1, 4210-2, and 4210-3 are acquired at different time points using the same sequence. Similarly, the segments 4220-1 and 4220-2 are also acquired at different time points using the same sequence. The segments 4210-1, 4210-2, 4210-3, 4220-1, and 4220-2 are associated with the same tissue of interest within the same field of view.

As shown in FIG. 8, the segment 4210-1 is directly selected as one subset of the fully sampled k-space MRI imaging data and then processed by the trained neural network 4300. On the other hand, a combination 4220 of the segments 4220-1 and 4220-2 is selected as one subset of the fully sampled k-space MRI imaging data and then processed by the trained neural network 4300. Similarly, a combination 4210-a of the segments 4210-2 and 4210-3 is selected as one subset of the fully sampled k-space MRI imaging data and then processed by the trained neural network 4300. Similar to FIG. 6, it is possible to process the subsets 4210-1, 4220 and 4210-a using a single trained neural network 4300, respectively. Alternatively, it is also possible to process the subsets 4210-1, 4220 and 4210-a using three copies of the trained neural network 4300 in parallel (as shown in FIG. 8).

In general, the techniques disclosed herein in connection with the single-shot sequences can be also applied to fully sampled k-space MRI imaging data acquired using a multi-shot sequence. For example, as shown in FIG. 7, the four segments 4201, 4202, 4203, and 4204 can be first combined together into the fully sampled k-space MRI imaging data 4200. Then, the techniques disclosed herein in connection with the single-shot sequences, e.g., as shown in FIGS. 5 and 6 can be applied. This could be very useful for multi-shot sequences in case the line acquisition order of the sequence cannot be modified, i.e., only the reconstruction part could be modified.

Block 3200: processing, by the trained neural network, each one of the at least one subset of the fully sampled k-space MRI imaging data, respectively.

As described above in connection with FIG. 5-FIG. 8, respectively, each one of the at least one subset of the fully sampled k-space MRI imaging data may be processed either by the trained neural network 4300 in a successive manner or by a respective copy of the trained neural network 4300 in a parallel manner.

Block 3300: determining spatial domain MRI imaging data associated with the tissue of interest within the field of view based on corresponding output of the trained neural network.

According to various examples, if a single subset of the fully sampled k-space MRI imaging data is obtained at block 3100, e.g., as shown in FIG. 5, output 4221 of the trained neural network 4300 is determined as the spatial domain MRI imaging data associated with the tissue of interest within the field of view. By determining spatial domain MRI imaging data associated with the tissue of interest within the field of view based on a selected single subset of the fully sampled k-space MRI imaging data, the trained neural network only has to be executed once, and thereby the reconstruction duration is reduced.

Alternatively, if the at least one subset of the fully sampled k-space MRI imaging data comprises multiple subsets, e.g., as shown in FIGS. 6-8, the determining of the spatial domain MRI imaging data 4500 associated with the tissue of interest within the field of view comprises: determining an average of the respective output, e.g., 4211 and 4221 of FIGS. 6-7, or 4211, 4221, and 4211-*a* of FIG. 8, of the trained neural network 4300. Here, it is also possible to determine a weighted average or a sum of the respective output of the trained neural network 4300 as the spatial domain MRI imaging data.

Optionally or additionally, the method 3000 may further comprise determining a coil sensitivity map 4600 based on the fully sampled k-space MRI imaging data and the processing of each one of the at least one subset of the fully sampled k-space MRI imaging data is further based on the coil sensitivity map. For example, the coil sensitivity map may be determined based on lines of the central region of the k-space, e.g., 4230 of FIGS. 5-8, and the coil sensitivity map may be a further input of the trained neural network 4300 when processing each one of the at least one subset of the fully sampled k-space MRI imaging data, respectively. For example, techniques with respect to utilizing coil sensitivity maps as disclosed in a non-patent literature—Hammernik, Kerstin, et al. "*Systematic evaluation of iterative deep neural networks for fast parallel MRI reconstruction with sensitivity-weighted coil combination.*" Magnetic Resonance in Medicine 86.4 (2021): 1859-1872. —may be applied herein.

Optionally or additionally, the trained neural network 4300 may comprise at least one data consistency layer as disclosed in a non-patent literature—Hammernik, Kerstin, et al. "*Systematic evaluation of iterative deep neural networks for fast parallel MRI reconstruction with sensitivity-weighted coil combination.*" Magnetic Resonance in Medicine 86.4 (2021): 1859-1872. As shown in FIG. 5, the data consistency 4700 is based on the fully sampled k-space MRI imaging data. Optionally or additionally, the data consistency 4700 can also be applied in any one of the processing pipelines of FIGS. 6-8.

Optionally or additionally, the method 3000 may further comprise post-processing 4700 of the corresponding output of the trained neural network. For example, the post-processing may comprise filtering, normalization, or any other imaging processing steps. As a further example, the method 3000 may further comprises performing motion correction on each one of the respective output of the trained neural network, i.e., a post-processing step. For example, the motion correction can be performed using spatial registration algorithms or any other approaches known to the skilled person.

Optionally or additionally, the method 3000 may further comprise training the neural network 4300 using the under-sampled k-space MRI imaging data associated with the tissue of interest. According to the disclosure, various training methods of neural networks may be applied to train the neural network 4300, such as supervised learning, unsupervised learning, semi-supervised learning, reinforce learning and etc.

According to the method 3000, by obtaining, based on an input dimension of a trained neural network, at least one subset of a fully sampled k-space MRI imaging data such that a dimension of each one of the at least one subset is the same as the input dimension, and thereby each one of the at least one subset of the fully sampled k-space MRI imaging data can be respectively processed by the trained neural network. Accordingly, a full FOV spatial domain MRI imaging data can be determined based on corresponding output of the trained neural network. I.e., the fully sampled k-space MRI imaging data can be reconstructed using a trained neural network which is trained using undersampled k-space MRI imaging data. Therefore, there is no need to develop and/or train of dedicated neural networks for reconstructing fully sampled k-space data. I.e., a neural network trained using undersampled k-space MRI imaging data can be used to reconstruct either undersampled k-space MRI imaging data or fully sampled k-space data. Further, it is also possible to increase the quality of the reconstructed image, especially for low-field MRI systems.

FIG. 9 is a block diagram of a computing device 9000 according to various examples. The computing device 9000 may comprise a processor 9020, a memory 9030, and an input/output interface 9010. The processor 9020 is configured to load program code from the memory 9030 and execute the program code. Upon executing the program code, the processor 9020 performs the method 3000 for processing fully sampled k-space MRI imaging data (e.g., the solid lines with an arrow of FIG. 1) associated with a tissue of interest within a FOV. In an exemplary embodiment, the computing device 9000 (and/or one or more components comprised therein) includes processing circuitry that is configured to perform one or more functions and/or operations of the computing device 9000 (and/or component(s) therein).

Referring to FIG. 3 again, in an exemplary embodiment, the MRI scanner 100 may further comprise the computing device 9000 configured to perform the method 3000. The computing device 9000 may be the image reconstruction electronics 150 and/or the pulse sequence electronics 140. That is, the computing device 9000 may be embedded in (e.g. in controller 135) or connected with the MRI scanner 100, and thereby the MRI scanner 100 may be also configured to perform the method 3000.

Summarizing, techniques have been described that facilitate processing fully sampled k-space MRI imaging data—e.g., acquired using a low-field MRI apparatus—using a trained neural network which is trained using undersampled k-space MRI imaging data. By obtaining, based on an input dimension of the trained neural network, at least one subset of the fully sampled k-space MRI imaging data such that a dimension of each one of the at least one subset is the same as the input dimension, and thereby each one of the at least one subset of the fully sampled k-space MRI imaging data can be respectively processed by the trained neural network. Accordingly, a full FOV spatial domain MRI imaging data can be determined based on corresponding output of the trained neural network. I.e., the fully sampled k-space MRI imaging data can be reconstructed using a trained neural network which is trained using undersampled k-space MRI imaging data. Therefore, there is no need to develop and/or train of dedicated neural networks for reconstructing fully sampled k-space data. I.e., a neural network trained using undersampled k-space MRI imaging data can be used to reconstruct either undersampled k-space MRI imaging data or fully sampled k-space data. Further, it is also possible to increase the quality of the reconstructed image, especially for low-field MRI systems.

Although the disclosure has been shown and described with respect to certain exemplary embodiments, equivalents and modifications will occur to others skilled in the art upon the reading and understanding of the specification. The present disclosure includes all such equivalents and modifications and is limited only by the scope of the appended claims.

For illustration, the disclosure is explained in detail based on the Cartesian trajectories of the k-space. The techniques disclosed herein can be also applied to other trajectories of the k-space, such as, radial trajectories, spiral trajectories.

Further, the techniques disclosed herein can be also applied to 3-D MRI imaging data.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

The various components described herein may be referred to as "modules," "units," or "devices." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such modules, units, or devices, as applicable and relevant, may alternatively be referred to herein as "circuitry," "controllers," "processors," or "processing circuitry," or alternatively as noted herein.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or nonvolatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

The invention claimed is:

1. A computer-implemented method for processing fully sampled k-space magnetic resonance imaging (MRI) imaging data associated with a tissue of interest within a field of view, comprising:

obtaining, based on an input dimension of a trained neural network, at least one subset of the fully sampled k-space MRI imaging data such that a dimension of each one of the at least one subset is the same as the input dimension, the trained neural network being trained using undersampled k-space MRI imaging data associated with the tissue of interest;

processing, by the trained neural network, each one of the at least one subset of the fully sampled k-space MRI imaging data, respectively;

determining spatial domain MRI imaging data associated with the tissue of interest within the field of view based on corresponding output of the trained neural network; and providing an electronic signal representing the spatial domain MRI imaging data as an output.

2. A computing device comprising:

a processor; and a memory storing program code that when executed by the processor, causes the processor to:

obtain, based on an input dimension of a trained neural network, at least one subset of the fully sampled k-space MRI imaging data such that a dimension of each one of the at least one subset is the same as the input dimension, the trained neural network being trained using undersampled k-space MRI imaging data associated with a tissue of interest;

process, using the trained neural network, each one of the at least one subset of the fully sampled k-space MRI imaging data, respectively;

determine spatial domain MRI imaging data associated with the tissue of interest within a field of view based on corresponding output of the trained neural network; and generate and provide an electronic signal representing the spatial domain MRI imaging data as an output of the computing device.

3. The computer-implemented method of claim 1, wherein the fully sampled k-space MRI imaging data is acquired in a single-shot MRI measurement and the obtaining of the at least one subset of the fully sampled k-space MRI imaging data comprises:

subsampling, based on the input dimension, the fully sampled k-space MRI imaging data to two or more segments such that a dimension of each of the two or more segments is the same as the input dimension; and arbitrarily selecting, among the two or more segments, at least one segment as the at least one subset of the fully sampled k-space MRI imaging data.

4. The computer-implemented method of claim 1, wherein:

the fully sampled k-space MRI imaging data is acquired in a multi-shot MRI measurement and a respective segment of the fully sampled k-space MRI imaging data is acquired in each of the multiple shots, and the obtaining of the at least one subsets of the fully sampled k-space MRI imaging data comprises:

in response to a dimension of the respective segment being the same as the input dimension, arbitrarily selecting, among the respective segments acquired in the multiple shots, at least one segment as the at least one subset; and in response to the dimension of the respective segment being smaller than the input dimension: combining two or more segments of the respective segments of the fully sampled k-space MRI imaging data such that a dimension of a combination of the two or more segments is the same as the input dimension, and selecting the combination as one of the at least one subset.

5. The computer-implemented method of claim 1, further comprising:

determining a coil sensitivity map based on the fully sampled k-space MRI imaging data, wherein the processing of each one of the at least one subset of the fully sampled k-space MRI imaging data being further based on the coil sensitivity map.

6. The computer-implemented method of claim 1, wherein:

the at least one subset of the fully sampled k-space MRI imaging data comprises multiple subsets, and the determining of the spatial domain MRI imaging data associated with the tissue of interest within the field of view comprises: determining an average in the spatial domain of the respective spatial domain MRI imaging data output of the trained neural network.

7. The computer-implemented method of claim 1, wherein the trained neural network comprises at least one data consistency layer.

8. The computer-implemented method of claim 1, further comprising: performing motion correction on each one of the respective output of the trained neural network.

9. The computer-implemented method of claim 1, further comprising: training the neural network using the undersampled k-space MRI imaging data associated with the tissue of interest.

10. A non-transitory computer-readable storage medium with an executable program stored thereon, that when executed, instructs a processor to perform the method of claim 1.

11. An MRI scanner comprising the computing device of claim 2.

12. The computer-implemented method of claim 1, wherein the fully sampled k-space MRI imaging data is acquired in:

(a) a single-shot MRI measurement, the obtaining of the at least one subset of the fully sampled k-space MRI imaging data including: subsampling, based on the input dimension, the fully sampled k-space MRI imaging data to two or more segments such that a dimension of each of the two or more segments is the same as the input dimension, and arbitrarily selecting, among the two or more segments, at least one segment as the at least one subset of the fully sampled k-space MRI imaging data; or (b) a multi-shot MRI measurement and a respective segment of the fully sampled k-space MRI imaging data is acquired in each of the multiple shots, the obtaining of the at least one subsets of the fully sampled k-space MRI imaging data including: in response to a dimension of the respective segment being the same as the input dimension, arbitrarily selecting, among the respective segments acquired in the multiple shots, at least one segment as the at least one subset, and in response to the dimension of the respective segment being smaller than the input dimension: combining two or more segments of the respective segments of the fully sampled k-space MRI imaging data such that a dimension of a combination of the two or more segments is the same as the input dimension, and selecting the combination as one of the at least one subset.

13. The computer-implemented method of claim 3, wherein:

a further fully sampled k-space MRI imaging data associated with the tissue of interest within the field of view is acquired in a further single-shot MRI measurement; and the method further comprises determining a combination of the fully sampled k-space MRI imaging data and the further fully sampled k-space MRI imaging data, the subsampling being based on the combination.

14. The computer-implemented method of claim 4, wherein:

at least one segment of a further fully sampled k-space MRI imaging data associated with the tissue of interest within the field of view is acquired in a further multi-shot MRI measurement and a respective segment of the at least one segment of the further fully sampled k-space MRI imaging data is acquired in a respective shot of the further multi-shot MRI measurement, the method further comprises: determining a respective combination of the respective segment of the fully sampled k-space MRI imaging data and the respective segment of the further fully sampled k-space MRI imaging data, the arbitrary selecting or said combining being based on the respective combination.

15. The computer-implemented method of claim 13, wherein the further fully sampled k-space MRI imaging data is acquired immediately after the fully sampled k-space MRI imaging data.

*     *     *     *     *